(12) United States Patent
Jost et al.

(10) Patent No.: US 10,109,451 B2
(45) Date of Patent: Oct. 23, 2018

(54) APPARATUS CONFIGURED FOR ENHANCED VACUUM ULTRAVIOLET (VUV) SPECTRAL RADIANT FLUX AND SYSTEM HAVING THE APPARATUS

(71) Applicant: Applied Materials, Inc., Santa Clara, CA (US)

(72) Inventors: Georg Jost, Munich (DE); Ludwig Ledl, Gröbenzell (DE); Bernhard G. Mueller, Finsing (DE); George Tzeng, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/431,098

(22) Filed: Feb. 13, 2017

(65) Prior Publication Data

US 2018/0233317 A1 Aug. 16, 2018

(51) Int. Cl.
| | |
|---|---|
| *H01J 37/00* | (2006.01) |
| *H01J 37/02* | (2006.01) |
| *H01J 37/18* | (2006.01) |
| *H01J 37/26* | (2006.01) |

(52) U.S. Cl.
CPC ............ *H01J 37/026* (2013.01); *H01J 37/18* (2013.01); *H01J 37/26* (2013.01); *H01J 2237/0047* (2013.01)

(58) Field of Classification Search
CPC .......... H01J 37/026; H01J 37/18; H01J 37/26; H01J 2237/0047

USPC ................. 250/306, 307, 310, 311
See application file for complete search history.

(56) References Cited

U.S. PATENT DOCUMENTS

| | | | |
|---|---|---|---|
| 2005/0006590 A1* | 1/2005 | Harrison | ............... G01J 3/02 250/372 |
| 2007/0023655 A1 | 2/2007 | Nishikata et al. | |
| 2011/0079711 A1 | 4/2011 | Buehler et al. | |

FOREIGN PATENT DOCUMENTS

JP    2006344444 A    12/2006

OTHER PUBLICATIONS

PCT International Search Report and Written Opinion dated Jun. 8, 2018, for International Application No. PCT/EP2018/053199.

* cited by examiner

*Primary Examiner* — Nicole Ippolito
*Assistant Examiner* — Hanway Chang
(74) *Attorney, Agent, or Firm* — Patterson + Sheridan LLP

(57) ABSTRACT

A charge control apparatus for controlling charge on a substrate in a vacuum chamber is described. The apparatus includes a light source emitting a beam of radiation having a divergence; a mirror configured to reflect the beam of radiation, wherein a curvature of a mirror surface of the curved mirror is configured to reduce the divergence of the beam of radiation; and a mirror support configured to rotatably support the curved mirror, wherein a rotation of the mirror varies the direction of the beam of radiation.

20 Claims, 6 Drawing Sheets

APPARATUS CONFIGURED FOR ENHANCED VACUUM ULTRAVIOLET (VUV) SPECTRAL RADIANT FLUX AND SYSTEM HAVING THE APPARATUS

TECHNICAL FIELD

Embodiments of the present disclosure relate to charged control of a substrate or reduction of electrostatic charges on a substrate, respectively. Particularly, charge control or reduction of electrostatic charges is provided on large area substrates. Embodiments relate to apparatuses for enhanced vacuum ultraviolet (VUV) spectral radiant flux and systems having such apparatuses, specifically to a charge control apparatus for substrates in a vacuum chamber; a charged particle beam device; and a method of charge control on a substrate.

BACKGROUND

A current trend is the manufacture of an increasing number of electronic and particularly optoelectronic devices on substrates, e.g. in order to provide displays, circuit boards and/or solar cells. In particular, there is an increasing demand for flat display elements such as flat screens. The standards for liquid crystal displays (LCD) and other display elements, in which control elements, for example thin film transistors (TFTs), are used, increase. In addition, the increasing resolution of displays leads to decreasing structure dimensions (critical dimensions) and to a decreased layer thickness which raises the sensitivity for ESD caused defects of such display devices.

The substrate of a flat panel display may be made of glass or of another insulating material. Charges which may accumulate on the surfaces of the substrate during handling and processing of the substrate may lead to an electrical polarization of the substrate. This may increase the risk of damage by electrostatic discharge (ESD) during handling and processing of the substrate. Accordingly, it would be beneficial to protect a substrate from damage which may be caused by electrostatic discharge. Further, charging of a substrate may cause a deterioration of imaging during E-beam Inspection (EBI).

Vacuum Ultraviolet radiation (VUV) aims to eliminate electrostatic charges by directly ionizing residual molecules in a depressurized environment. Vacuum LCD manufacturing equipment, particularly devices utilizing electron beams (SEM, etc.) cannot benefit from conventional ionizers static electricity neutralization because their working mechanism requires a gaseous environment. Further, charge neutralization on large area substrates is difficult with existing radiation sources in light of the size of the substrates.

SUMMARY

According to one embodiment, a charge control apparatus for controlling charge on a substrate in a vacuum chamber is provided. The apparatus includes a light source emitting a beam of radiation having a divergence; a mirror configured to reflect the beam of radiation, wherein a curvature of a mirror surface of the curved mirror is configured to reduce the divergence of the beam of radiation; and a mirror support configured to rotatably support the curved mirror, wherein a rotation of the mirror varies the direction of the beam of radiation.

According to another embodiment, a charged particle beam device is provided. The charged particle beam device includes a charged particle beam microscope configured for imaging a portion of a substrate provided in a vacuum chamber; and a charge control apparatus for controlling the charge on the substrate in the vacuum chamber. The charged control apparatus includes a light source emitting a beam of radiation having a divergence; a mirror configured to reflect the beam of radiation, wherein a curvature of a mirror surface of the curved mirror is configured to reduce the divergence of the beam of radiation; and a mirror support configured to rotatably support the curved mirror, wherein a rotation of the mirror varies the direction of the beam of radiation.

According to a further embodiment, a method of controlling charge on a substrate is provided. The method includes reducing the divergence of a beam of radiation of a light source with a curved surface of a mirror; and moving a reflected beam of radiation reflected from the curved surface over the substrate by rotation of the mirror.

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following.

DETAILED DESCRIPTION OF EMBODIMENTS

Figure 1A:
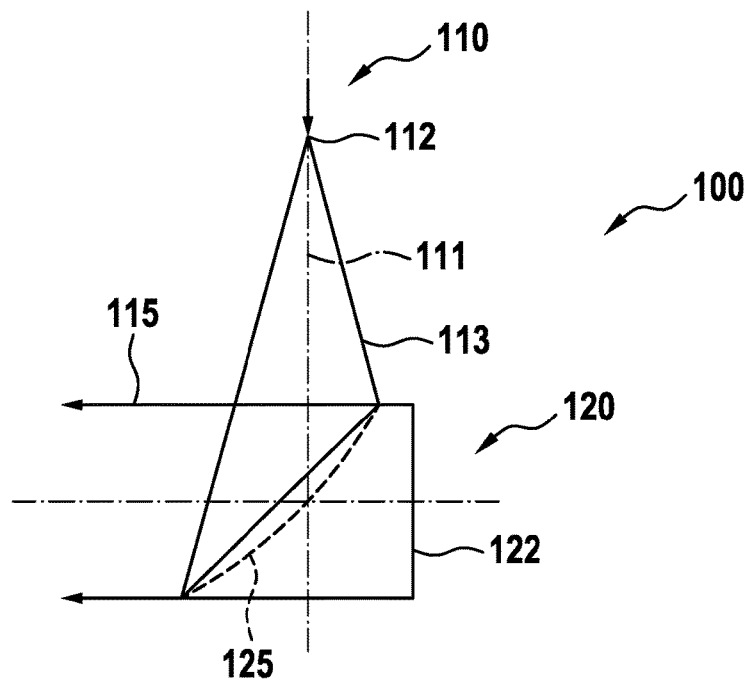
FIGS. 1A and 1B show a charge control apparatus according to embodiments of the present disclosure.

Reference will now be made in detail to the various embodiments, one or more examples of which are illustrated in the figures. Each example is provided by way of explanation and is not meant as a limitation. Further, features illustrated or described as part of one embodiment can be used on or in conjunction with other embodiments to yield yet a further embodiment. It is intended that the description includes such modifications and variations.

Within the following description of the drawings, the same reference numbers refer to the same components. Only the differences with respect to the individual embodiments are described. The structures shown in the drawings are not necessarily depicted true to scale but rather serve the better understanding of the embodiments.

The term "substrate" as used herein embraces both inflexible substrates, e.g., a glass substrate, or a glass plate, and flexible substrates, such as a web or a foil. The substrate may be a coated substrate, wherein one or more thin layers of materials are coated or deposited on the substrate, for example by a physical vapor deposition (PVD) process or a chemical vapor deposition process (CVD).

Embodiments described herein relate to large area substrates, in particular large area substrates for the display market. According to some embodiments, large area substrates or respective substrate supports may have a size of at least 1 m². The size may be from about 1.375 m2 (1100 mm×1250 mm–Gen 5) to about 9 m², more specifically from about 2 m² to about 9 m² or even up to 12 m². The substrates or substrate receiving areas, for which the structures, apparatuses, and methods according to embodiments described herein are provided, can be large area substrates as described herein. For instance, a large area substrate or carrier can be GEN 5, which corresponds to about 1.375 m² substrates (1.1 m×1.25 m), GEN 7.5, which corresponds to about 4.39 m² substrates (1.95 m×2.25 m), GEN 8.5, which corresponds to about 5.7 m² substrates (2.2 m×2.5 m), or even GEN 10, which corresponds to about 9 m² substrates (2.88 m×3130 m). Even larger generations such as GEN 11 and GEN 12 and corresponding substrate areas can similarly be implemented.

Without limiting the scope of protection of the present application, in the following the charged particle beam device, e.g. a charged particle beam microscope, or components thereof will exemplarily be referred to as a charged particle beam device including the detection of secondary or backscattered particles, such as electrons. Embodiments can still be applied for apparatuses and components detecting corpuscles, such as secondary and/or backscattered charged particles in the form of electrons or ions, photons, X-rays or other signals in order to obtain a specimen image. When referring to corpuscles, the corpuscles are to be understood as light signals in which the corpuscles are photons as well as particles, in which the corpuscles are ions, atoms, electrons or other particles. As described herein, discussions and descriptions relating to the detection are exemplarily described with respect to electrons in scanning electron microscopes. Other types of charged particles, e.g. positive ions, could be utilized by the device in a variety of different instruments.

According to embodiments herein, which can be combined with other embodiments, a signal (charged particle) beam, or a signal (charged particle) beam let is referred to as a beam of secondary and/or backscattered particles. Typically, the signal beam or secondary beam is generated by the impingement of the primary beam or primary beamlet on a specimen. A primary charged particle beam or a primary charged particle beamlet is generated by a particle beam source and is guided and deflected on a specimen to be inspected or imaged.

Embodiments of the present disclosure relate to a charge control apparatus, for example an electrostatic charge remover. The charge control apparatus is configured for removing electrostatic charges from a substrate in a vacuum chamber. Particularly, a charge control apparatus according to the present disclosure is suitable and configured for large area substrates, for example substrates having a size of 1.4 m² or larger, such as 5 m² or larger. For example, the vacuum chamber can have a slit valve, e.g. for vacuum tight sealing of the vacuum chamber, and configured for loading of a large area substrate.

Charge control apparatuses according to the present disclosure can be provided for display manufacturing, for example for LCD displays or OLED displays. Further, glass handling of large area substrates can be improved due to reduced risk of ESD damage. According to yet further embodiments, charge control or removal of electrostatic charge on flexible substrates, such as webs or foils, can be provided. This may for example be used, according to some embodiments, for manufacturing of flexible displays.

A charge control apparatus can include a light source, such as a vacuum UV (VUV) light source. For example, a VUV light source can remove electrostatic charges in vacuum environments. Removal of electrostatic charges with a VUV light source can be beneficial, since charges of opposite polarity are not generated, as may be the case with a flood gun emitting charged particles.

Charge control apparatuses according to the present disclosure include a mirror, wherein a mirror surface has a curved surface configured to reduce a divergence of a beam of radiation emitted from the light source. Further, the mirror is supported by a mirror support, such that a direction of propagation of a reflected beam of radiation can be varied.

Figure 1B:
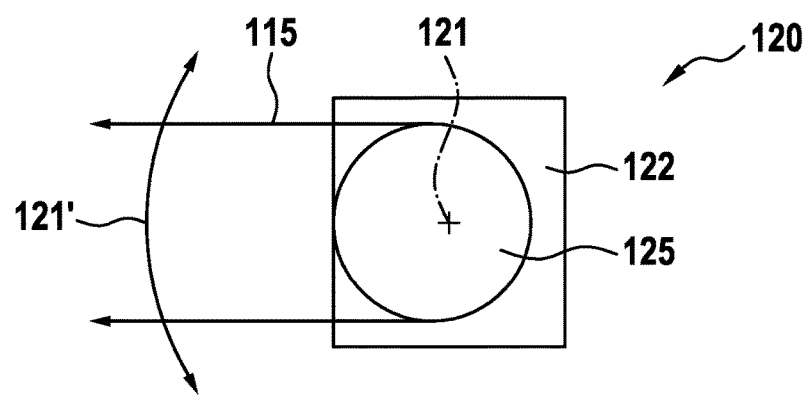

FIGS. 1A and 1B show a charge control apparatus 100. FIG. 1A shows a side view and FIG. 1B shows a top view. A light source 110, which is schematically illustrated by an arrow in FIG. 1A, emits a light beam 113. The light beam propagates along a propagation direction 111, i.e. an optical axis. The mirror 120 includes a mirror body 122 and a mirror surface 125. The mirror surface is curved. The curved surface is configured to reduce the divergence of the light beam 113. The reflected light beam 115 has a divergence smaller than the light beam 113 directed onto the mirror.

As described with respect to FIG. 1B, the mirror 120 having the mirror body 122 and the mirror surface 125 can be rotated around an axis 121. Rotation of the mirror results in a change of the propagation direction of the reflected light beam 115 as indicated by arrow 121'. A movement of the mirror allows for directing the reflected light beam 115 to various positions on a substrate. For example, the reflected light beam can be swept over the substrate. By sweeping or scanning the reflected light beam over the substrate, charge can be controlled, e.g. electrostatic charge can be removed, from various positions of the substrate.

According to some embodiments, which can be combined with other embodiments described herein, the mirror 120 can be a parabolic mirror. The curved mirror surface 125 can be part of a circular paraboloid. Accordingly, the mirror 120 can be provided with a focal length or a focus, respectively. An incident light beam having a crossover 112 at the focus of the parabolic mirror results in a reflected light beam being parallel or essentially parallel. The light source and the mirror can be arranged with respect to each other such that a crossover of the beam of radiations is provided at the focal point of the parabolic mirror. The divergence of the light beam 113 can be reduced upon reflection on the mirror surface 125. For example, a plane wave, i.e. a parallel beam, can be generated.

Embodiments described herein allow the reduction of the decrease of the local irradiance, which is directly proportional to the square distance from a light source, e.g. a VUV lamp having a divergence of for example 30°. An irradiance reduction for a VUV lamp with the distance, wherein the lamp has e.g. a divergence of 30°, limits the efficient VUV lamp useful range to, for example, 500 mm. For a typical distance from a VUV lamp of 500 mm, the VUV irradiated spot can be about 290 mm diameter compared to the <40 mm spot at the VUV lamp output. The radiance flux in W/cm² is at 500 mm distance, about 50 times lower compared to the VUV lamp output. Accordingly, for large area substrates, e.g. for super-sized vacuum LCD manufacturing equipment, multiple VUV lamps are to be fitted around a system to ensure a uniform VUV irradiation on a full display substrate.

Accordingly, embodiments of the present disclosure allow for a reduction of the number of lamps to result in a radiation efficiently removing charges on large area substrates.

According to some embodiments, which can be combined with other embodiments described herein, an off-axis parabola mirror is provided at the light source, e.g. in the VUV lamp radiation path. The light source can be provided at an off-axis parabola focus. A divergent incident light beam having an e.g. 30° VUV lamp irradiation angle, is collimated with the off-axis parabola mirror to a parallel radiant flux, e.g. with a designed size. With a VUV spectral parallel radiant flux, the VUV lamp radiation can reach long distance areas and is able to reach large full display size spaces.

Figure 2A:
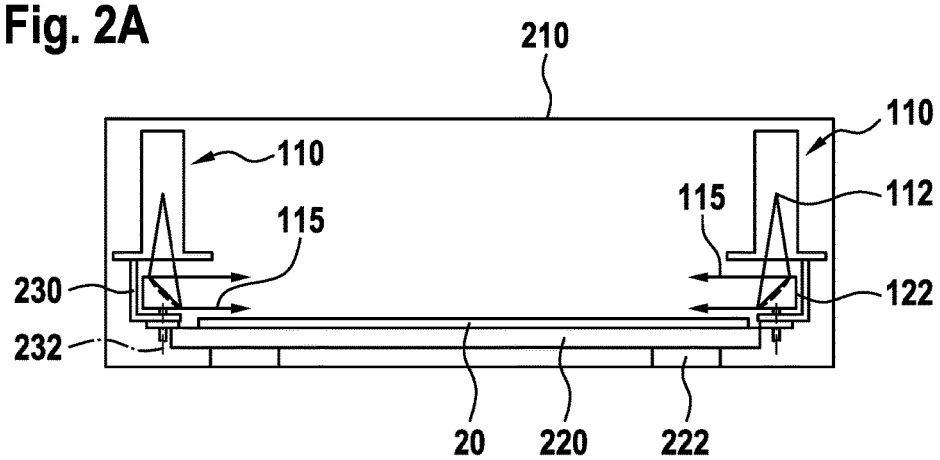
FIGS. 2A and 2B illustrate further charge control apparatuses according to embodiments of the present disclosure in a vacuum chamber and having, for example, a VUV lamp.
Figure 2B:
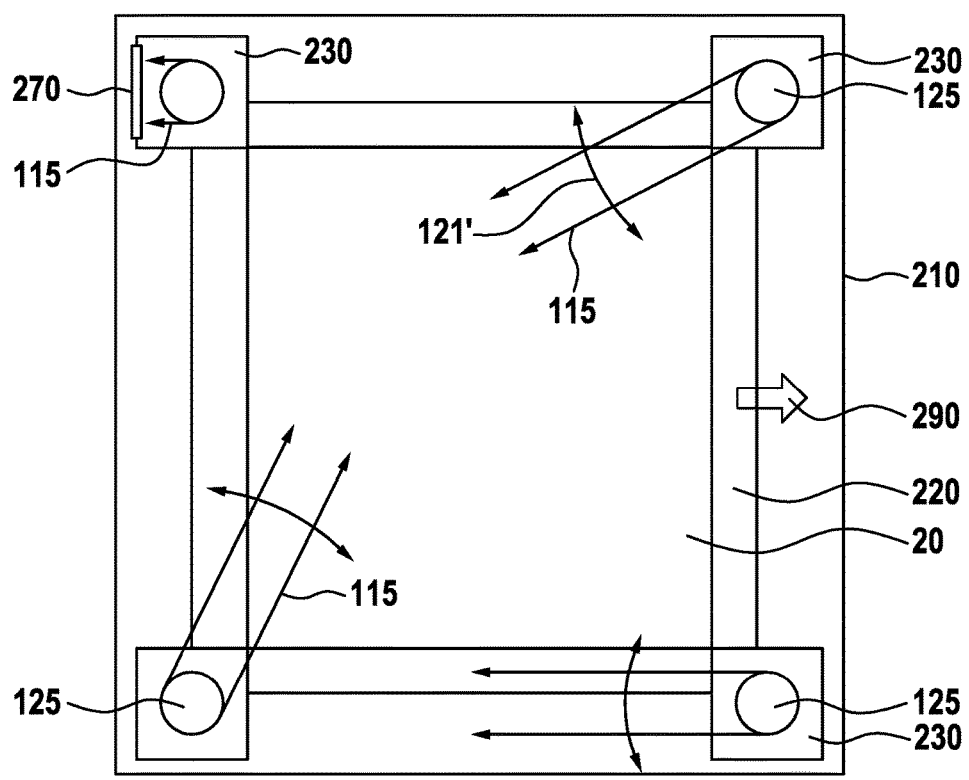

Embodiments of the present disclosure provide apparatuses configured for enhanced vacuum ultraviolet (VUV) spectral radiant flux, systems having the apparatus, and methods of operating thereof. For example, a charge control apparatus for substrates in a vacuum chamber is provided. The charge control apparatus includes a light source emitting a beam of radiation having a divergence; a mirror configured to reflect the beam of radiation, wherein a curvature of a mirror surface of the curved mirror is configured to reduce the divergence of the beam of radiation; and a mirror support configured to rotatably support the curved mirror, wherein a rotation of the mirror varies the direction of the beam of radiation FIGS. 2A and 2B show a side view and a top view of a charge control apparatus provided in a vacuum chamber 210. One or more charge control apparatuses 100 as shown in FIG. 1A are provided in the vacuum chamber. FIG. 2A shows two charge control apparatuses. FIG. 2B shows, for example, four charge control apparatuses. The reflected beam of radiation can be provided to a surface of a substrate 20. The substrate 20 can be mounted to a substrate support 220, for example a substrate support table. A drive 222 can be provided to move the substrate 20 within the vacuum chamber 210. Additionally or alternatively, the drive can be utilized to move the substrate 20 into the vacuum chamber or out of the vacuum chamber. According to other modifications, a substrate may be loaded with a robot having a robot arm in the vacuum chamber 210. According to some embodiments, which can be combined with other embodiments described herein, a substrate support can be a vacuum chuck or an electrostatic chuck. For example, an electrostatic chuck can hold the substrate due to electrostatic attracting forces and may be used for systems for display manufacturing.

A charge control apparatus can include a light source 110. The light source can emit a beam of radiation having a divergence, for example, after a crossover 112. The mirror 120 has a curved surface to reduce the divergence of the beam of radiation. The reflected beam of radiation, e.g. the reflected light beam 115, with a reduced divergence propagates from the mirror to the target surface, for example a substrate surface. The mirror 120 having the curved mirror surface 125 is supported by a mirror support 230. The mirror support 230 supports the mirror, wherein the mirror can, for example, rotate around axis 232. Rotation of the mirror around, for example, an axis 232 results in a movement of the reflected beam of radiation, e.g. the reflected light beam 115, as indicated by arrows 121'. Accordingly, the reflected light beam can be guided to different positions on the substrate 20. This is exemplarily shown in FIG. 2B.

According to some embodiments, which can be combined with other embodiments described herein, a charge control apparatus may also be provided in an idle position. This is exemplarily shown for the upper left charge control apparatus shown in FIG. 2B. The mirror 120 is rotated by 90° or more, for example 180° such that the reflected beam of radiation, e.g. the reflected light beam 115, is guided on a beam blanker 270. The beam blanker 270 can include a beam blocking element. The beam blocking element may have no or minimal reflection for a light beam incident on the beam blocking element.

Directing the reflected light beam 115 on the beam blanker avoids illumination of the substrate 20 without the need to switch off the light source 110. This may be particularly advantageous for imaging systems as exemplarily described with respect to FIG. 5, wherein sensitive detectors, for example photomultipliers (PM), are provided in the vacuum chamber. Since light sources, which may be utilized for charge control apparatuses described herein, are difficult to switch off and, particularly, switch on, blanking of the beam of radiation provides for an improved process control.

According to some embodiments, a substrate may be a stationary, for example on a substrate support table 220 as shown in FIG. 2A, while being processed by the charge control apparatus, for example, while electrostatic charge is removed from the substrate. According to further embodiments, which can be combined with other embodiments of the present disclosure, the substrate can be moved through a vacuum chamber 210 during processing with one or more charge control apparatuses described herein. This is indicated by arrow 290 in FIG. 2B. For example, a substrate can be moved continuously or quasi-continuously through a vacuum chamber 210 while being eliminated with a beam of radiation. The beam of radiation can be generated with apparatuses according to embodiments described herein or can be generated with methods according to embodiments described herein.

According to some embodiments, the vacuum chamber may include two charge control apparatuses. For example, a first charge control apparatus can be provided in one corner and a second charge control apparatus can be provided at a further corner of the vacuum chamber opposing the one corner. The further corner can be provided along a side of the vacuum chamber or along the diagonal of the vacuum chamber.

Figure 3:
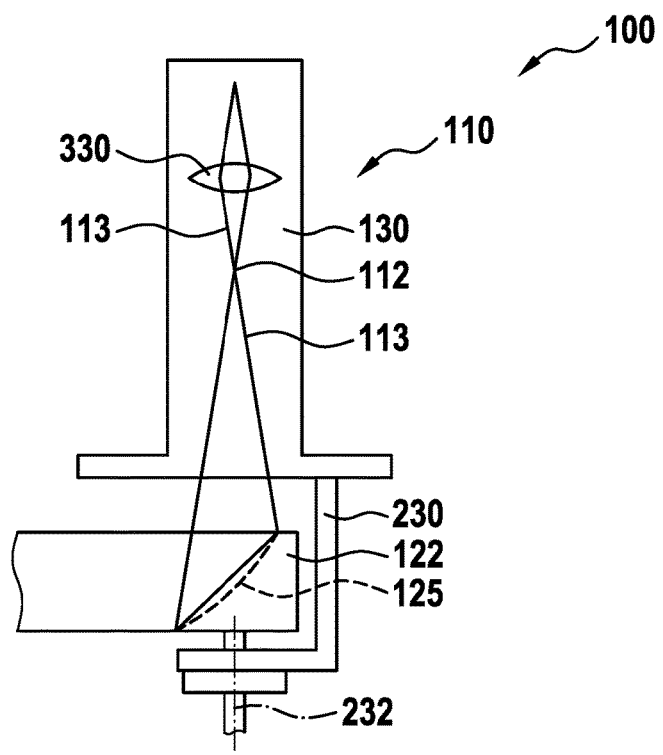
FIG. 3 shows further details of a charge control apparatus according to embodiments of the present disclosure.

FIG. 3 shows a charge control apparatus 100 illustrating further embodiments of the present disclosure. An emitter of a beam of radiation can be provided in a housing 130 of the light source 110. Further, a lens assembly having one or more lenses 330 can be provided, for example in the housing 130. The lens assembly can generate a crossover 112. The crossover 112 can be provided in the focus of the curved surface 125 of the mirror 120. For example, the curved surface 125 can be a mirror surface of the parabolic mirror. The beam of radiation, e.g. the light beam 113, is reflected at the mirror surface and redirected, for example towards the substrate. The mirror 120 is supported by the mirror support 230. The mirror 120 can be rotatably supported by the mirror support. For example, the mirror can rotate around the axis 232.

As shown in FIG. 3, a light source 110, such as a VUV source, can be mounted vertically in a parabola vertex axis. The beam of radiation with, for example a 20° to 40° irradiation angle, is projected onto the off-axis parabola mirror and reflected from the mirror as a collimated light spot, i.e. a reflected light beam. The collimated light spot, i.e. the reflected light beam with a divergence smaller than the irradiation angle of the light source, is conducted over large surfaces. The beam can be conducted over large surfaces through 90° to 180° rotation, such as rotations with the motor. A full 360° rotation may be possible.

As shown in FIG. 3, the mirror support 230 may further support the light source 110. This enables stable positioning between the mirror 120 and the focus thereof relative to the crossover 112 generated by the light source. According to some embodiments, which can be combined with other embodiments described herein, the light source can be a VUV lamp. For example, the light source can irradiate light in a UV range of 200 nm or below. The light source can be a VUV source with a radiation wavelength having a spectral energy distribution of 50% or more below 200 nm. Particularly, a radiation can have a wavelength of 170 nm or below such as about 160 nm. For example, a deuterium discharge lamp with a power of 100 W or above such as 180 W or above can be provided. The spectrum of the beam of radiation can be mainly from 120 nm to 400 nm, for example with high radiation density at 121 nm, 125 nm and 160 nm. As another example, an argon lamp with a main emission wavelength of 128 nm may be provided.

Figure 4A:
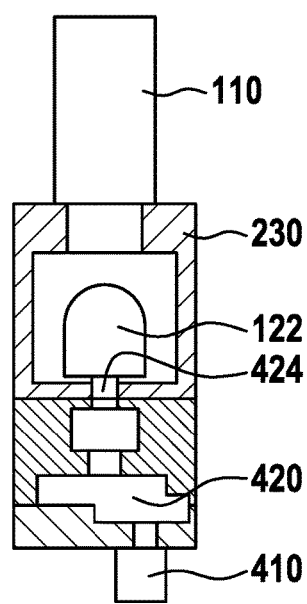
FIGS. 4A to 4C show further details of charge control apparatuses according to embodiments of the present disclosure and including a motor for rotating the mirror.
Figure 4B:
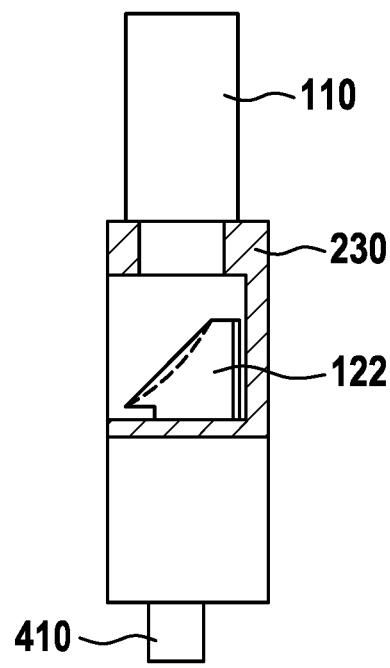
Figure 4C:
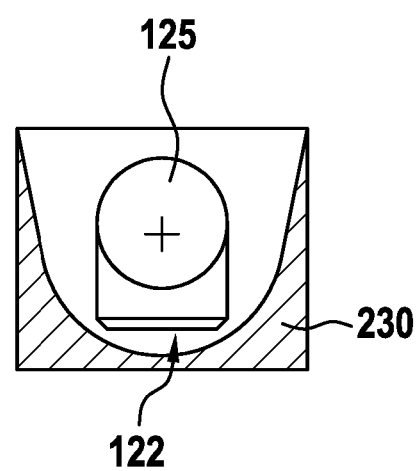

FIGS. 4A to 4C illustrate further details modifications of charge control apparatuses according to embodiments of the present disclosure. FIG. 4A shows a cross-sectional side view, FIG. 4B shows a side view, in FIG. 4C shows a further cross-sectional view, e.g. from the top when compared to FIG. 4A. A light source 110, for example a VUV lamp, is mounted on a mirror support 230, such as a mirror box. In the mirror support, an off-axis mirror 120 is mounted on an arbor or shaft. The arbor 424 can be a portion of a vacuum feed-through. The mirror 120 can rotate, e.g. by 360°, in a mirror box, i.e. mirror support 230.

The VUV lamp is mounted on the mirror support in such a manner that the light source origin or light source crossover coincide with the VUV off-axis mirror focal length. The VUV light source is mounted in the focal point of the off-axis parabolic mirror. The light source can be mounted on the optical axis of the parent parabola of the curved mirror and/or at the focal point of the parent parabola, i.e. the mirror can be an off-axis mirror. The off-axis parabolic mirror can be rotated by a motor 410 coupled to the feed-through arbor 424. For example, the motor can swing clockwise and counterclockwise to oscillate the VUV light spot, e.g. by 90° to 180°.

According to some embodiments, which may be combined with other embodiments described herein, to reduce the motor wear, a crank rocker mechanism 420, for example a four link crank-rocker mechanism or four bar crank rocker mechanism can be provided. Accordingly, the mirror 120 can swing clockwise and counterclockwise with the motor 410 rotating only in one direction, i.e. clockwise or counterclockwise. This may reduce motor and gear damage due to the acceleration and deceleration sequences. The crank-rocker mechanism 420 can be mounted in a box. The crank rocker mechanism 420 can be configured for a specific off-axis parabolic mirror swing angle.

Figure 5:
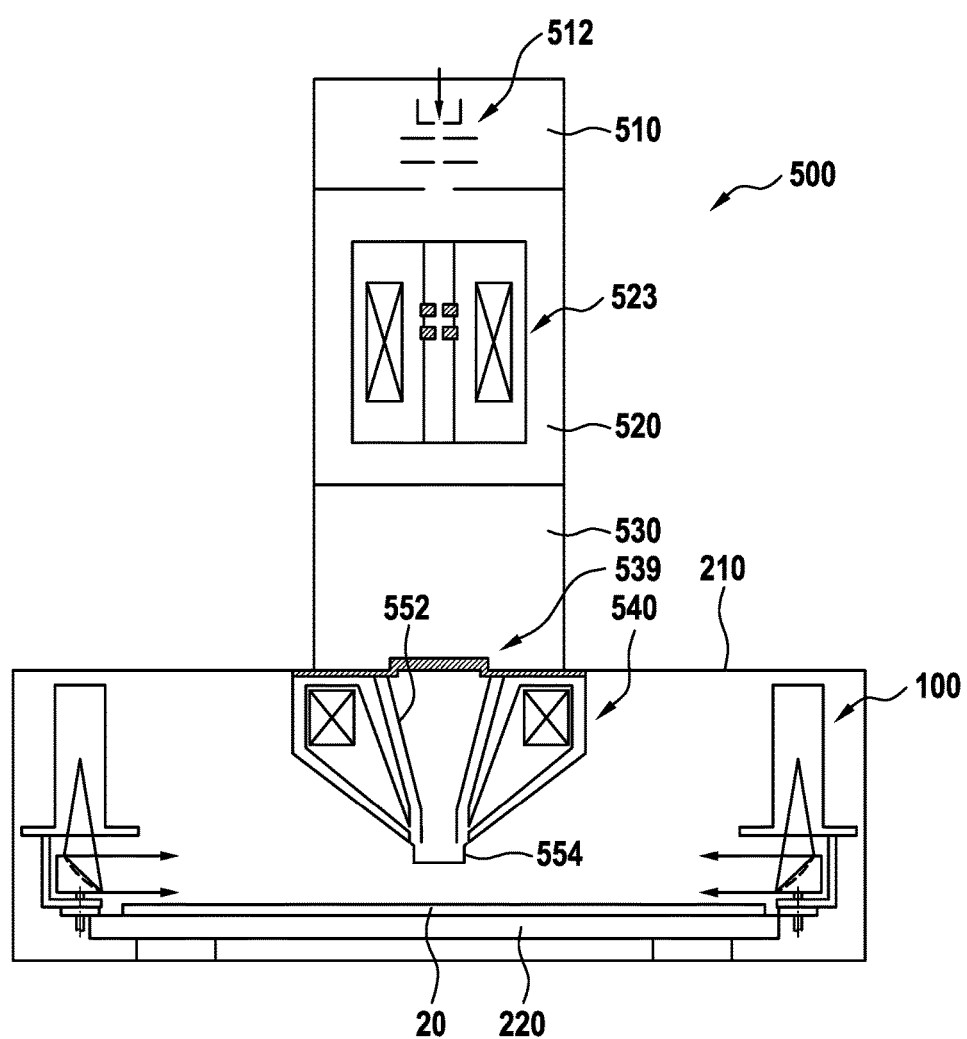
FIG. 5 shows a charged particle beam device according to embodiments of the present disclosure and including a charge control apparatus.

FIG. 5 shows a charged particle beam device or a charged particle beam microscope 500. An electron beam (not shown) may be generated by the electron beam source 512. Within the gun chamber 510, further beam shaping means like a suppressor, an extractor, and/or an anode may be provided. The electron beam source can include a TFE emitter. The gun chamber may be evacuated to a pressure of $10^{-8}$ mbar to $10^{-9}$ mbar.

In a further vacuum chamber 520 of the column of the charged particle beam microscope 500 a condenser lens can be provided. Further electron optical elements can be provided in the further vacuum chamber. The further electron optical elements can be selected from the group consisting of: a stigmator, correction elements for chromatic and/or spherical aberrations, and alignment deflectors for aligning the primary charged particle beam to an optical axis of the objective lens 540.

The primary electron beam can be focused on the substrate 20 by the objective lens 540. The substrate 20 is positioned on a substrate position on the substrate support 220. On impingement of the electron beam onto the substrate 20, signal electrons, for example, secondary and/or backscattered electrons, and/or x-rays, are released from the substrate 20, which can be detected by a detector 539.

In the exemplary embodiments described with respect to FIG. 5, a condenser lens 523 is provided. A two-stage deflection system (not shown) can be provided between the condenser lens and e.g. a beam limiting aperture, e.g. a beam shaping aperture, for alignment of the beam to the aperture. As shown in FIG. 5, the objective lens 540 can have a magnetic lens component having pole pieces, and having a coil. The objective lens focuses the primary electron beam on the substrate 20. Further, an upper electrode 552 and a lower electrode 554 form an electrostatic lens component of the objective lens 540. The lower electrode 554 is connected to a voltage supply (not shown). The lower electrode being the deceleration electrode of the immersion lens component, i.e. a retarding field lens component, of the objective lens is typically at a potential to provide a landing energy of the charged particles on the substrate of 2 keV or below, e.g. 500 V or 1 keV. The objective lens can be an electrostatic-magnetic compound lens having e.g. an axial gap or a radial gap, or the objective lens can be an electrostatic retarding field lens.

Further, a scanning deflector assembly can be provided. The scanning deflector assembly can, for example, be a magnetic, but preferably an electrostatic scanning deflector assembly, which is configured for high pixel rates. The scanning deflector assembly may be a single stage assembly. Alternatively, also a two-stage or even a three-stage deflector assembly can be provided for scanning. Each stage may be provided at a different position along the optical axis.

The charged particle beam microscope 500 shown in FIG. 5 includes a detector 539 in a detection vacuum area 530. The detector 539 includes a scintillator arrangement. The scintillator arrangement has an opening (not shown), for example an opening in the center of the scintillator arrangement. The opening serves for having the primary charged particle beam path through the detector. The scintillator arrangement can be segmented to have two or more scintillator segments.

Upon imaging of the substrate 20 or portions of the substrate 20, charge can accumulate on the area on which the charged particle beam impinges. Charge accumulation can adversely affect the measurement. For example, charging the sample changes the potential of the sample, which influences the landing energy of the primary charged particle beam on the substrate. Further, changing the potential of the sample can vary the collection efficiency of signal electrons, which may also influence the measurement in an unexpected manner, i.e. adversely affect the measurement. Accordingly, it is desirable to control the chart on the substrate.

According to some embodiments, which can be combined with other embodiments described herein, reference to charge control of the substrate, for example, reference to a charge control apparatus, can be understood as removal of electrostatic charge from the substrate.

FIG. 5 shows two charge control apparatuses 100 in the vacuum chamber 210. The charge control apparatuses can be used to remove charge from the substrate, which may have accumulated due to charged particle beam impingement.

As described above, the charge control apparatuses have a rotatable mirror. The rotatable mirror can allow for moving the reflected beam of radiation in an idle position, for example towards the beam blanker. During measurement with the charged particle beam device, e.g. charge particle beam microscope 500, a detector 539, which can include a scintillator and a photomultiplier, is switched on. The detector, for example, the photomultiplier can be sensitive to light emitted from the charge control apparatus. In order to avoid exposure of a photomultiplier to a beam of radiation from the charge control apparatus, for example a beam from a VUV lamp, the charge control apparatus can be operated to have the reflected beam in an idle position, wherein the reflected beam of radiation is blocked, for example by a beam blanker. This avoids exposing the photomultiplier to the radiation from the light source. According to some embodiments, which can be combined with other embodiments of the present disclosure, a charge control apparatus as described herein can be used in a charged particle beam device, for example a charged particle beam device for electron beam inspection (EBI).

According to yet further embodiments, charge that may have accumulated on a substrate during processing of the substrate, for example imaging of the substrate or other processing steps, may result in electrostatic discharge (ESD). Particularly upon separation of a substrate from a substrate support, for example a vacuum chuck or an electrostatic chuck, high voltages may occur due to ESD. The high voltages can destroy electronic or optoelectronic devices on the substrate. The handling and/or the transport of the substrate may be critical for ESD—caused defects. The substrate of a flat panel display may be made of glass or of another insulating material. Charges which may accumulate on the surfaces of the substrate during handling and processing of the substrate may lead to an electrical polarization of the substrate. This may increase the risk of damage by electrostatic discharge (ESD) during handling and processing of the substrate. With decreasing substrate thickness and smaller critical dimensioning, the electronic devices become more and more sensitive to ESD damage. The risk of damage by electrostatic discharge ESD may be reduced or eliminated by removing electrostatic charges from the substrate, for example before handling and/or transport of a substrate. Embodiments described herein can be utilized for processes including glass handling, for example in a vacuum chamber as described with respect to FIGS. 2A and 2B.

Figure 6:
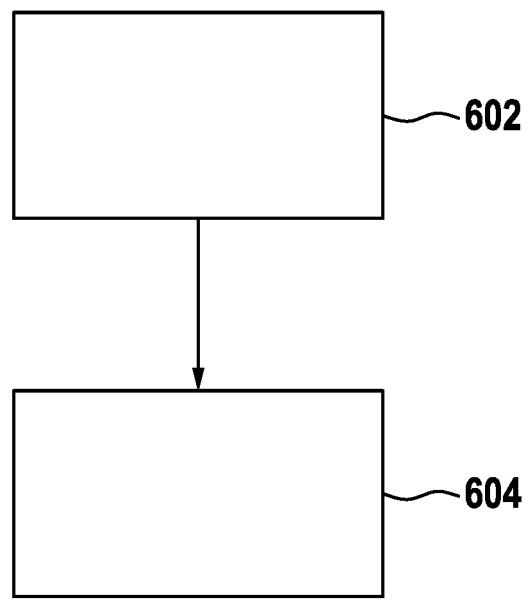
FIG. 6 shows a flowchart illustrating methods of charge control according to embodiments of the present disclosure.

FIG. 6 shows a flowchart illustrating embodiments of methods for controlling charge on a substrate, particularly a large area substrate, and methods of operating a charge control apparatus according to embodiments described herein. A divergence of a beam of radiation of light source is reduced with a curved surface of the mirror, as indicated by block 602. For irradiation of the substrate for charge control, the reflected beam, i.e. the beam reflected from the curved surface of the mirror, is moved by a rotation of the mirror. This is indicated by block 604.

According to yet further embodiments, the above described charge control, for example removal of electrostatic charge, is provided before handling the substrate, such as a class substrate. Particularly, charge removal is provided before, such as directly before, releasing a substrate from a substrate support. According to additional or alternative implementations, a beam can be moved in an idle position. For example, the idle position can be a rotation position of the mirror directing the reflected beam towards a beam blanker. Blocking of the reflected beam can be particularly useful for imaging of a substrate, such as large area substrate with a charged particle beam device.

The present disclosure has several advantages including charge control, e.g. by removal of electrostatic charge, with the capability to operate in vacuum and/or a capability to operate for large area substrates, particularly for substrates having a size of 1.4 m$^2$ or above or substrates having a size of 5.7 m$^2$ or above. Further, the reflected beam of operation can be moved to a desired position. Yet further, a desired position can include an idle position to avoid exposure of a detector to a light beam of, e.g. a VUV lamp. Charge control as described herein can be particularly advantageous for imaging with a charged particle microscope, such as EBI, and for glass handling with a reduced risk of ESD image.

While the foregoing is directed to some embodiments, other and further embodiments may be devised without departing from the basic scope, and the scope is determined by the claims that follow.

The invention claimed is:

1. A charge control apparatus for controlling charge on a large area substrate in a vacuum chamber, comprising:
   a light source emitting a beam of radiation having a divergence;
   a mirror configured to reflect the beam of radiation, wherein a curvature of a mirror surface of the mirror is configured to reduce the divergence of the beam of radiation to substantially collimate the reflected beam of radiation; and
   a mirror support configured to rotatably support the curved mirror, wherein a rotation of the mirror varies a direction of the reflected beam of radiation to sweep over the large area substrate for reducing charges.

2. The charge control apparatus according to claim 1, wherein the mirror is a parabolic mirror having a focal point.

3. The charge control apparatus according to claim 2, wherein the parabolic mirror is an off-axis parabolic mirror.

4. The charge control apparatus according to claim 2, wherein the light source and the mirror are arranged with respect to each other such that a crossover of the beam of radiations is provided at the focal point of the parabolic mirror.

5. The charge control apparatus according to claim 1,
   wherein the mirror support is configured for a rotation of the mirror by at least 90°, and
   wherein the mirror can be rotated in an idle position.

6. The charge control apparatus according to claim 1, further comprising:
   a crank-rocker mechanism for rotating the mirror support clockwise and counterclockwise.

7. The charge control apparatus according to claim 1, wherein the light source is a VUV source with a radiation wavelength having a spectral energy distribution of 50% or more below 200 nm.

8. The charge control apparatus according to claim 1, wherein the mirror and the mirror support are arranged in a vacuum chamber.

9. The charge control apparatus according to claim 8, wherein the vacuum chamber has a slit valve configured for loading of a large area substrate.

10. A charge control apparatus for controlling charge on a substrate in a vacuum chamber, comprising:
    a light source emitting a beam of radiation having a divergence;
    a mirror configured to reflect the beam of radiation, wherein a curvature of a mirror surface of the mirror is configured to reduce the divergence of the beam of radiation;

a mirror support configured to rotatably support the curved mirror, wherein a rotation of the mirror varies a direction of the beam of radiation, wherein the mirror support is configured for a rotation of the mirror by at least 90°, and wherein the mirror can be rotated in an idle position; and a beam blanker at the idle position.

11. A charged particle beam device, comprising:

a charged particle beam microscope configured for imaging a portion of a substrate provided in a vacuum chamber; and a charge control apparatus for controlling charge on the substrate in the vacuum chamber, wherein the charged control apparatus comprises:

a light source emitting a beam of radiation having a divergence;

a mirror configured to reflect the beam of radiation, wherein a curvature of a mirror surface of the mirror is configured to reduce the divergence of the beam of radiation; and a mirror support configured to rotatably support the curved mirror, wherein a rotation of the mirror varies a direction of the reflected beam of radiation to sweep over the substrate for reducing charges thereon.

12. The charged particle beam device according to claim 11, wherein the mirror is a parabolic mirror having a focal point.

13. The charged particle beam device according to claim 12, wherein the parabolic mirror is an off-axis parabolic mirror.

14. The charged particle beam device according to claim 12, wherein the light source and the mirror are arranged with respect to each other such that a crossover of the beam of radiations is provided at the focal point of the parabolic mirror.

15. The charged particle beam device according to claim 11, wherein the mirror support is configured for a rotation of the mirror by at least 90°, and wherein the mirror can be rotated in an idle position.

16. A charged particle beam device, comprising:

a charged particle beam microscope configured for imaging a portion of a substrate provided in a vacuum chamber; and a charge control apparatus for controlling charge on the substrate in the vacuum chamber, wherein the charged control apparatus comprises:

a light source emitting a beam of radiation having a divergence;

a mirror configured to reflect the beam of radiation, wherein a curvature of a mirror surface of the mirror is configured to reduce the divergence of the beam of radiation;

a mirror support configured to rotatably support the curved mirror, wherein a rotation of the mirror varies a direction of the beam of radiation, wherein the mirror support is configured for a rotation of the mirror by at least 90°, and wherein the mirror can be rotated in an idle position; and a beam blanker at the idle position.

17. A method of controlling charge on a substrate, comprising:

reducing a divergence of a beam of radiation of a light source with a curved surface of a mirror; and moving a reflected beam of radiation reflected from the curved surface over the substrate by rotation of the mirror; and removing charge on the substrate by irradiating the substrate with the reflected beam of radiation for charge control.

18. The method of claim 17, further comprising:

handling the substrate to be released from a substrate support after removal of electrostatic charge due to the charge control.

19. The method of claim 17, further comprising:

moving the reflected beam in an idle position.

20. A method of controlling charge on a substrate, comprising:

reducing a divergence of a beam of radiation of a light source with a curved surface of a mirror; and moving a reflected beam of radiation reflected from the curved surface over the substrate by rotation of the mirror;

irradiating the substrate for charge control;

moving the reflected beam in an idle position; and imaging a portion of the substrate with a charged particle beam while the reflected beam is in the idle position.

* * * * *